United States Patent
Li et al.

(10) Patent No.: US 9,653,310 B1
(45) Date of Patent: May 16, 2017

(54) METHODS FOR SELECTIVE ETCHING OF A SILICON MATERIAL

(71) Applicant: Applied Materials, Inc., Santa Clara, CA (US)

(72) Inventors: Zihui Li, Santa Clara, CA (US); Xing Zhong, Foster City, CA (US); Anchuan Wang, San Jose, CA (US); Nitin K. Ingle, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/961,495

(22) Filed: Dec. 7, 2015

Related U.S. Application Data

(60) Provisional application No. 62/254,169, filed on Nov. 11, 2015.

(51) Int. Cl.
*H01L 21/302* (2006.01)
*H01L 21/461* (2006.01)
*H01L 21/3065* (2006.01)

(52) U.S. Cl.
CPC ................. *H01L 21/3065* (2013.01)

(58) Field of Classification Search
None
See application file for complete search history.

(56) References Cited

U.S. PATENT DOCUMENTS

| | | | |
|---|---|---|---|
| 7,683,447 B2 | 3/2010 | Wang et al. | |
| 7,767,977 B1 | 8/2010 | Godet et al. | |
| 7,888,653 B2 | 2/2011 | Kellerman et al. | |
| 8,101,510 B2 | 1/2012 | Godet et al. | |
| 8,808,563 B2 | 8/2014 | Wang et al. | |
| 8,956,980 B1 * | 2/2015 | Chen ................. | H01L 21/31116 216/79 |
| 2002/0124867 A1 * | 9/2002 | Kim ........................ | B08B 7/00 134/1.2 |
| 2012/0135273 A1 | 5/2012 | Horng et al. | |
| 2012/0135543 A1 | 5/2012 | Shin et al. | |
| 2013/0089988 A1 | 4/2013 | Wang et al. | |
| 2014/0038311 A1 | 2/2014 | Kim et al. | |

FOREIGN PATENT DOCUMENTS

WO    0046838 A2    8/2000

OTHER PUBLICATIONS

Nakazawa, Yutaka, et al. "Selective Etching of Silicon Native Oxide with Remote-Plasma-Excited Anhydrous Hydrogen Fluoride", Japanese Journal of Applied Physics., vol. 37, pp. L 536-L 538 (1998).

Han, Yong-Pil, "HF Vapor Etching and Cleaning of Silicon Wafer Surfaces", Massachusetts Institute of Techology, Department of Chemical Engineering, Jul. 1999. (186 pages), Library Archives, Feb. 10, 2000.

Tuda, Mutumi, et al., "Highly Selective Removal of Residual Deposited Films and Oxide Hard Masks on Polysilicon Gate Electrodes in Anhydrous HF Gases", Japanese Journal of Applied Physics, vol. 43, No. 3, pp. 945-951 (2004).

* cited by examiner

*Primary Examiner* — Roberts Culbert
(74) *Attorney, Agent, or Firm* — Patterson + Sheridan, LLP

(57) ABSTRACT

The present disclosure provides methods for etching features in a silicon material includes performing a remote plasma process formed from an etching gas mixture including chlorine containing gas to remove a silicon material disposed on a substrate.

5 Claims, 3 Drawing Sheets

US 9,653,310 B1

METHODS FOR SELECTIVE ETCHING OF A SILICON MATERIAL

CROSS-REFERENCE TO RELATED APPLICATIONS

This application claims benefit of U.S. Provisional Application Ser. No. 62/254,169 filed Nov. 11, 2015, which is incorporated by reference in its entirety.

BACKGROUND

Field

Embodiments of the present invention generally relate to methods for selectively etching a silicon material disposed on a substrate for semiconductor manufacturing applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As circuit densities increase for next generation devices, the widths of interconnects, such as vias, trenches, contacts, gate structures and other features, as well as the dielectric materials therebetween, decrease to 45 nm and 32 nm dimensions and beyond, whereas the thickness of the dielectric layers remain substantially constant, with the result of increasing the aspect ratios of the features. In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. In manufacturing three dimensional (3D) stacking of semiconductor chips, multiple materials in the semiconductor structures are often utilized to form high-density of transistor devices.

When forming these features, such interconnection structures in a film stack disposed on a substrate, an etch process using a photoresist layer as an etching mask is often utilized. Typically, conventional etchants have low selectivity to etch one material over another material present in the structure, such as gate dielectric, gate electrode and/or underlying materials in a gate structure, thereby leaving void space, also known as silicon recess, foot, or other associated defects on the interface of different materials. Low selectivity of the etchants between different materials often result in etching profile deformation, specifically forming defects on sidewalls, corners, or bottom the substrate surface which may deteriorate device performance and electrical properties of the device structure.

Thus, the etch selectivity for polysilicon and silicon materials to other materials, such as silicon oxide or silicon nitride, in the device structure has to be very high in order to protect or passivate the sidewall or features of the device structure or the surface of the device structure.

Thus, there is a need for improved methods for etching a silicon material with high selectivity at semiconductor chip manufacture applications or other semiconductor devices.

SUMMARY

The present disclosure provides methods for etching a silicon material in a device structure in semiconductor applications. In one example, a method for etching features in a silicon material includes performing a remote plasma process formed from an etching gas mixture including chlorine containing gas to remove a silicon material disposed on a substrate.

In another example, a method for etching features in a silicon material includes supplying an etching gas mixture including a chlorine containing gas to a silicon material disposed on a substrate in a processing chamber and applying a remote plasma power to generate a remote plasma source from the etching gas mixture to etch the silicon material disposed on the substrate.

In yet another example, a method for forming features in a silicon material includes selectively etching a silicon material disposed on a substrate by using a remote plasma source containing chlorine etchants without fluorine etchants.

DETAILED DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the invention generally relate to methods and apparatus for etching a silicon material from a device structure disposed on a substrate. In one example, the method includes etching a silicon material from a remote plasma source including chlorine containing etchants with optional inert gas. The chlorine containing etchants dominantly remove the silicon material from the substrate without attacking other materials included in the structure formed on the substrate, thus providing a selective etching process to etch the silicon material. The chlorine containing etchants may be supplied from a remote plasma source so as to gently remove the silicon material without over aggressively attacking the materials formed on the substrate.

Figure 1:
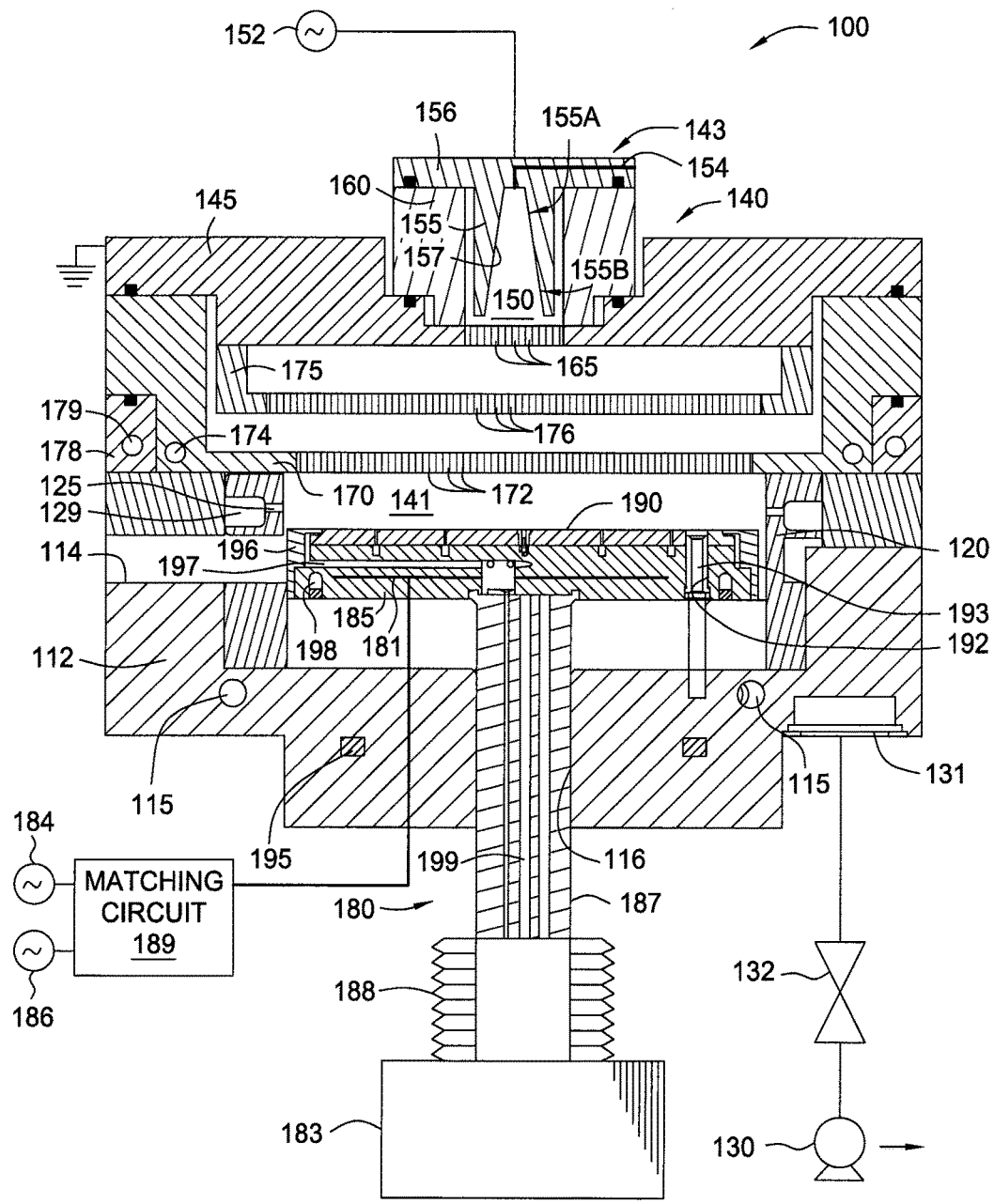
FIG. 1 depicts an etching processing chamber which may be utilized to perform an etching process on a substrate.

FIG. 1 is a cross sectional view of an illustrative processing chamber 100 suitable for conducting a gate electrode residual removal process as further described below. The processing chamber 100 may be configured to remove materials from a material layer disposed on a substrate surface. The processing chamber 100 is particularly useful for performing the plasma assisted dry etch process. The processing chamber 100 may be a Frontier™ PCxT Reactive Preclean™ (RPC), AKTIV Pre-Clean™, Siconi™ or Capa™ chamber, which is available from Applied Materials, Santa Clara, Calif. It is noted that other vacuum processing chambers available from other manufactures may also be adapted to practice the present invention.

The processing chamber 100 includes a chamber body 112, a lid assembly 140, and a support assembly 180. The lid assembly 140 is disposed at an upper end of the chamber body 112, and the support assembly 180 is at least partially disposed within the chamber body 112.

The chamber body 112 includes a slit valve opening 114 formed in a sidewall thereof to provide access to the interior of the processing chamber 100. The slit valve opening 114 is selectively opened and closed to allow access to the interior of the chamber body 112 by a wafer handling robot (not shown).

In one or more implementations, the chamber body 112 includes a channel 115 formed therein for flowing a heat transfer fluid therethrough. The chamber body 112 can further include a liner 120 that surrounds the support assembly 180. The liner 120 is removable for servicing and cleaning. In one or more embodiments, the liner 120 includes one or more apertures 125 and a pumping channel 129 formed therein that is in fluid communication with a vacuum system. The apertures 125 provide a flow path for gases into the pumping channel 129, which provides an egress for the gases within the processing chamber 100.

The vacuum system can include a vacuum pump 130 and a throttle valve 132 to regulate flow of gases through the processing chamber 100. The vacuum pump 130 is coupled to a vacuum port 131 disposed in the chamber body 112 and therefore, in fluid communication with the pumping channel 129 formed within the liner 120. The lid assembly 140 includes at least two stacked components configured to form a plasma volume or cavity therebetween, forming a remote plasma source. In one or more embodiments, the lid assembly 140 includes a first electrode 143 ("upper electrode") disposed vertically above a second electrode 145 ("lower electrode") confining a plasma volume or cavity 150 therebetween. The first electrode 143 is connected to a power source 152, such as an RF power supply, and the second electrode 145 is connected to ground, forming a capacitance between the two electrodes 143,145 to provide a remote plasma to the processing region 141.

In one or more implementations, the lid assembly 140 includes one or more gas inlets 154 (only one is shown) that are at least partially formed within an upper section 156 of the first electrode 143. The one or more process gases enter the lid assembly 140 via the one or more gas inlets 154. The one or more gas inlets 154 are in fluid communication with the plasma cavity 150 at a first end thereof and coupled to one or more upstream gas sources and/or other gas delivery components, such as gas mixers, at a second end thereof. In one or more embodiments, the first electrode 143 has an expanding section 155 that houses the plasma cavity 150.

In one or more implementations, the expanding section 155 is an annular member that has an inner surface or diameter 157 that gradually increases from an upper portion 155A thereof to a lower portion 155B thereof. As such, the distance between the first electrode 143 and the second electrode 145 is variable. That varying distance helps control the formation and stability of the plasma generated within the plasma cavity 150. A plasma generated in the plasma cavity 150 is defined in the lid assembly 140 prior to entering into a processing region 141 above the support assembly 180 wherein the substrate is proceed, the plasma is considered as a remote plasma source that generated remotely from the processing region 141.

The lid assembly 140 can further include an isolator ring 160 that electrically isolates the first electrode 143 from the second electrode 145. The lid assembly 140 can further include a distribution plate 170 and blocker plate 175 adjacent the second electrode 145. The second electrode 145, distribution plate 170 and blocker plate 175 can be stacked and disposed on a lid rim 178 which is connected to the chamber body 112. In one or more implementations, the second electrode 145 can include a plurality of gas passages or apertures 165 formed beneath the plasma cavity 150 to allow gas from the plasma cavity 150 to flow therethrough. The distribution plate 170 is substantially disc-shaped and also includes a plurality of apertures 172 or passageways to distribute the flow of gases therethrough. In one or more embodiments, the distribution plate 170 includes one or more embedded channels or passages 174 for housing a heater or heating fluid to provide temperature control of the lid assembly 140. The blocker plate 175 includes a plurality of apertures 176 to provide a plurality of gas passages from the second electrode 145 to the distribution plate 170. The apertures 176 can be sized and positioned about the blocker plate 175 to provide a controlled and even flow distribution of gases to the distribution plate 170.

The support assembly 180 can include a support member 185 to support a substrate (not shown in this view) for processing within the chamber body 112. The support member 185 can be coupled to a lift mechanism 183 through a shaft 187 which extends through a centrally-located opening 116 formed in a bottom surface of the chamber body 112. The lift mechanism 183 can be flexibly sealed to the chamber body 112 by a bellows 188 that prevents vacuum leakage from around the shaft 187.

In one embodiment, the electrode 181 that is coupled to a plurality of RF bias power sources 184, 186. The RF bias power sources 184, 186 are coupled between the electrode 181 disposed in the support member 185. The RF bias power excites and sustains a plasma discharge formed from the gases disposed in the processing region 141 of the chamber body.

In the embodiment depicted in FIG. 1, the dual RF bias power sources 184, 186 are coupled to the electrode 181 disposed in the support member 185 through a matching circuit 189. The signal generated by the RF bias power sources 184, 186 is delivered through matching circuit 189 to the support member 185 through a single feed to ionize the gas mixture provided in the processing chamber 100, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts. Additional bias power sources may be coupled to the electrode 181 to control the characteristics of the plasma as needed.

The support member 185 can include bores 192 formed therethrough to accommodate lift pins 193, one of which is shown in FIG. 1. Each lift pin 193 is constructed of ceramic or ceramic-containing materials, and are used for substrate-handling and transport. The lift pin 193 is moveable within its respective bore 192 when engaging an annular lift ring 195 disposed within the chamber body 112. The support assembly 180 can further include an edge ring 196 disposed about the support member 185.

The temperature of the support assembly 180 can be controlled by a fluid circulated through a fluid channel 198 embedded in the body of the support member 185. In one or more implementations, the fluid channel 198 is in fluid communication with a heat transfer conduit 199 disposed through the shaft 187 of the support assembly 180. The fluid channel 198 is positioned about the support member 185 to provide a uniform heat transfer to the substrate receiving surface of the support member 185. The fluid channel 198 and heat transfer conduit 199 can flow heat transfer fluids to either heat or cool the support member 185. Any suitable heat transfer fluid may be used, such as water, nitrogen, ethylene glycol, or mixtures thereof. The support assembly 180 can further include an embedded thermocouple (not shown) for monitoring the temperature of the support surface of the support member 185. For example, a signal from the thermocouple may be used in a feedback loop to control the temperature or flow rate of the fluid circulated through the fluid channel 198.

The support member 185 can be moved vertically within the chamber body 112 so that a distance between support member 185 and the lid assembly 140 can be controlled. A sensor (not shown) can provide information concerning the position of support member 185 within processing chamber 100.

A system controller (not shown) can be used to regulate the operations of the processing chamber 100. The system controller can operate under the control of a computer program stored on a memory of a computer. The computer program may include instructions that enable the preclean process described below to be performed in the processing chamber 100. For example, the computer program can dictate the process sequencing and timing, mixture of gases, chamber pressures, RF power levels, susceptor positioning, slit valve opening and closing, wafer cooling and other parameters of a particular process.

Figure 2:
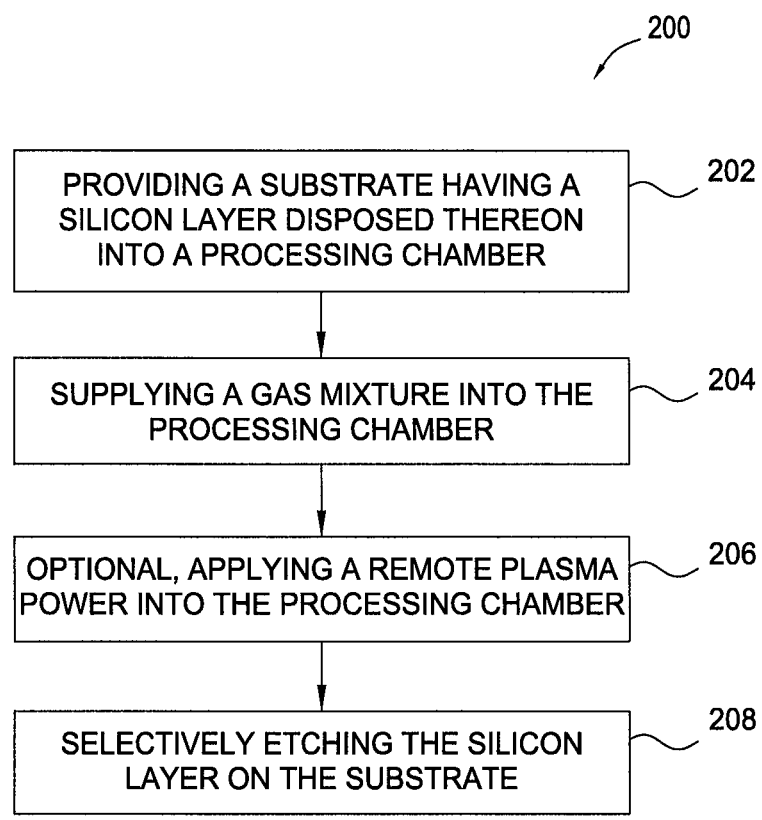
FIG. 2 depicts a flow diagram of a method for a silicon material disposed on a substrate to form features in the silicon material.
Figure 3A:
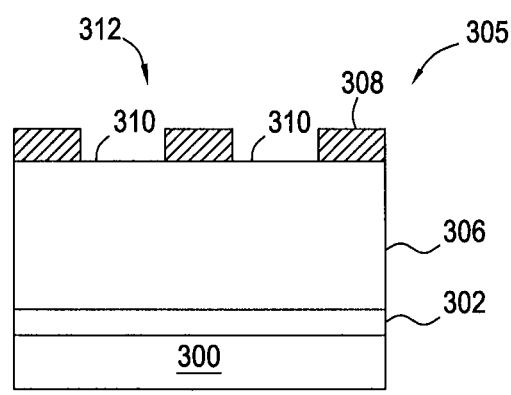
FIG. 3A-3B depict one example of cross sectional views of a sequence for etching a silicon material disposed on a substrate depicted in FIG. 2.
Figure 3B:
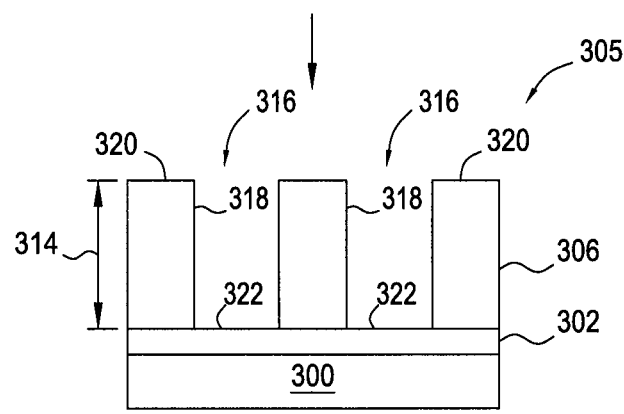

FIG. 2 illustrates a method 200 for etching a silicon material disposed on a substrate, which may be later utilized to form a device structure for semiconductor devices, such as a gate structure, a contact structure, a STI structure, a back-end interconnection structure, or any suitable structures as needed. FIGS. 3A-3B are cross-sectional views of a portion of a silicon material 306 disposed on a substrate 300 with corresponding to various stages of the method 200. In one example, the silicon material 306 may be utilized to form gate structures for three dimensional (3D) FinFET semiconductor applications. Alternatively, the method 200 may be beneficially utilized to etch or remove residuals for other types of structures.

The method 200 begins at operation 202 by providing a substrate, such as the substrate 300 depicted in FIG. 3A, having a film stack 305 formed on an optional material layer 302 disposed on the substrate 300, as shown in FIG. 3A. The substrate 300 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 203 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter substrate.

The optional material layer 302 is disposed between the substrate 300 and the film stack 305. In the embodiments wherein the optional material layer 302 is not present, the film stack 305 may be directly formed on the substrate 300 as needed. In one example, the optional material layer 302 is an insulating material. Suitable examples of the insulating material may include silicon oxide material, silicon nitride material, silicon oxynitride material, or any suitable insulating materials. Alternatively, the optional material layer 302 may be any suitable materials including conductive material or non-conductive material as needed.

The film stack 305 includes at least a silicon material 306 and a patterned mask layer 308 disposed on the silicon material 306. It is noted that the silicon material 306 may be later utilized to form a gate structure, a contact structure, an interconnection, a STI (shallow trench isolation) structure or any suitable structures for semiconductor devices, such as a FINFET device structure. In one embodiment, the silicon material 306 may have a thickness between about 45 nm and about 70 nm.

In one example, the silicon material 306 may be a crystalline silicon layer, such as a single crystalline, polycrystalline, or monocrystalline silicon layer, formed by an epitaxial deposition process. Alternatively, the silicon material 306 may be a doped silicon layer, including a p-type doped silicon layer or a n-type doped layer. Suitable p-type dopant includes B dopants, Al dopants, Ga dopants, In dopants, or the like. Suitable n-type dopant includes N dopants, P dopants, As dopants, Sb dopants, or the like. In yet another example, the silicon material 306 may be a Ge doped silicon layer, such as a GeSi layer, or tungsten polysilicon (W/poly), tantalum silicon nitride (TaSiN), and the like. In the embodiment depicted in FIG. 3A, the silicon material 306 is a polysilicon layer having a thickness between about 45 nm and about 60 nm.

In one example, some other materials, such as a dielectric layer selected from a group consisting of silicon oxide, silicon nitride, silicon oxynitride, high-k material, or combinations thereof and the like, may also be formed on desired locations on the substrate 300 as needed. In another example, high-k materials, dielectric materials having dielectric constants greater than 4.0, may also be utilized as needed. Suitable examples of the high-k material layer include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others.

A patterned mask layer 308 with a plurality of openings 312 formed therein may be disposed on the silicon material 306, exposing a portion 310 of the silicon material 306 to facilitate transferring features into the silicon material 306. The patterned mask layer 308 may be a single layer of hardmask layer, photoresist layer, or a composite layer with both a hardmask layer and a photoresist layer. Suitable examples of the hardmask layer, if present, include silicon oxide, silicon nitride, silicon oxynitride, silicon carbide, silicon oxycarbide, amorphous carbon, titanium nitride, titanium oxide, titanium oxynitride, tantalum nitride, tantalum oxide, tantalum oxynitride, or any other suitable materials. The photoresist layer, if present, may be any suitable photosensitive resist materials, such as an e-beam resist (for example, a chemically amplified resist (CAR)) and deposited and patterned in any suitable manner. The opening 312 may have a width less than 50 nm, such as less than 30 nm, such as between about 1 nm and about 10 nm, to form features in the silicon material 306 with aspect ratio greater than at least 10:1.

At operation 204, an etching gas mixture is supplied into the processing chamber 100 to etch the portions 310 of the silicon material 306 exposed by the patterned mask layer 308, as shown in FIG. 3B, until a predetermined depth 314 of a feature 316 is formed in the silicon material 306. The patterned mask layer 308 servers as an etching mask during the etch process of the silicon material 306. The etching gas mixture is continuously supplied to etch the silicon material 306 until the depth 314 of the features 316 are formed in the silicon material 306 exposing the underlying substrate 300 or optional material layer 302, if present.

In one embodiment, the etching gas mixture selected to etch the silicon material 306 includes at least a chlorine containing gas. Suitable examples of the chlorine containing gas include $Cl_2$, HCl, $CCl_4$, $CHCl_3$, $CH_2Cl_2$, $CH_3Cl$, or the like.

While supplying the chlorine containing gas in the etching gas mixture, a hydrogen containing gas may also be optionally supplied during the etch process. Suitable examples of the hydrogen containing gas include $H_2$, $H_2O$, $H_2O_2$, or the like. An inert gas may also be supplied into the etching gas mixture to assist the profile control as needed. Examples of the inert gas supplied in the gas mixture include Ar, He, Ne, Kr, Xe or the like. In one particular example, the etching gas mixture includes $Cl_2$, $H_2$ and Ar or He.

In one embodiment, the chlorine containing gas supplied in the etching gas mixture may be maintained at a flow rate by volume between about 100 sccm and about 10000 sccm. The optional $H_2$ gas may be maintained at a flow rate by volume between about 0 sccm and about 10000 sccm. The optional inert gas may be supplied to the processing chamber at a flow rate by volume between about 0 sccm and about 10000 sccm. Alternatively, the flow amount of the chlorine containing gas and the optional hydrogen containing gas and the inert gas may be supplied in the gas mixture by a predetermined ratio. For example, the gas flow rate ratio by volume of the chlorine containing gas to the hydrogen containing gas is controlled at between about 1:100 and about 100:1. Alternatively, the gas flow rate ratio by volume of the chlorine containing gas to the inert gas is controlled at between about 1:1 and about 1:1000.

The etching gas mixture is supplied through the plasma cavity 150 into the processing chamber 100 to form a remote plasma source in the plasma cavity 150 from the etching gas mixture for etching the silicon material 306. The etching gas mixture supplied in the operation 204 does not include a fluorine containing gas. The chlorine etchants from the etching gas mixture, without fluorine etchants, may dominantly attack the Si—Si bond of the silicon material 306 without attacking other portions of the substrate 300, which may include other dielectric materials. It is believed that chlorine etchants would not dominantly attack Si—O or Si—N bonding, like fluorine etchants conventionally utilized, thus providing a good etching selectivity during the silicon material etching process.

The amount of gases introduced into the processing chamber 100 from the etching gas mixture may be varied and adjusted to accommodate, for example, the thickness of the silicon material 306 to be removed, the geometry of the substrate being cleaned, the volume capacity of the plasma, the volume capacity of the chamber body, as well as the capabilities of the vacuum system coupled to the chamber body.

It is noted that the ration between the chlorine containing gas to hydrogen containing gas may also be adjusted to improve the etching selectivity, including the selectivity between the silicon material 306 and the substrate 300 or between the silicon material 306 and other materials disposed on the substrate 300 (e.g., the selectivity of the silicon nitride layer or the silicon oxide layer to the silicon material 306 or the selectivity of the silicon nitride or silicon oxide materials to materials in the substrate, such as a silicon material, a conductive material or a metal silicide layer, among others).

At operation 206, a remote plasma power from the power source 152 is generated to form a plasma in the plasma cavity 150 from the etching gas mixture supplied at operation 204. The plasma generated remotely in the plasma cavity 150 during the etching process at block 306 may have the etchants dissociated to form a relatively mild and gentle etchants, so as to slowly, gently and gradually etch the treated etching stop layer 426 until the underlying substrate 402 is exposed.

As compared to conventional in-situ plasma etching process, the remote plasma process performed at operation 206 to remove the silicon material 306 may be controlled to proceed at a slow rate utilizing the remote plasma source from the power source 152. As a result, the remote plasma process provides good control for the interface etching and promotes high etching selectivity so as to allow precise etching end point of the silicon material 306 being removed from the substrate 300 without damaging the adjacent material layer on the substrate 300. The chlorine etchants from the etching gas mixture may chemically react and predominantly remove the silicon material 306 from the substrate 300 without overly aggressive physical bombarding, sputtering or attacking the substrate surface, providing a mild etching process that slowly and selectively removes the silicon material 306 with desired management on the sidewalls 318 and the top surface 320 or the feature profile.

During the etching process, several process parameters may be regulated to control the etching process. In one exemplary embodiment, a process pressure in the processing chamber 100 is regulated to less than 0.5 Torr, such as between about 10 mTorr and about 100 mTorr. Alternatively, a RF bias power may be optionally supplied through the RF bias power sources 184, 186 to the electrode 181 disposed in the substrate support member 185. For example, a RF bias power of about less than 300 Watts, such as less than 100 Watts, for example between about 20 Watts to about 95 Watts, may be applied while supplying etching gas mixture as needed. A RF source power may be optionally supplied to the processing chamber 100 as needed. A substrate temperature is maintained between about 25 degrees Celsius to about 1000 degrees Celsius, such as between about 30 degrees Celsius and about 500 degrees Celsius, for example about 50 degrees Celsius and 150 degrees Celsius. In one embodiment, no RF bias power or no RF source power is provided during the etching process to reduce ion bombardment. In another example, a RF bias power without RF source power is provided during the etching process to reduce ion bombardment. In yet another example, no RF bias power is provided during the etching process to reduce ion bombardment.

At operation 208, the silicon material 306 is selectively etched in the etching process until a bottom surface 322 of the optional material layer 302 or the substrate 300 is exposed, if the optional material layer 302 is not present. As discussed above, the plasma is generated remotely in the remote plasma source. Thus, the chlorine etchants, which is believed to predominately etch silicon material without attacking other material on the substrate 300, dissociated from the removal gas mixture from the remote plasma is relatively mild and gentle, so as to slowly, gently and gradually chemically react the silicon material 306 in a steady manner so that the silicon material 306 may be removed in a mild/gentle manner without attacking or damaging the un-treated region so as to enable a successful selective removal process.

Thus, methods for etching a silicon material to form features with desired profile and dimensions in the silicon material for three dimensional (3D) device structure of semiconductor chips are provided. The methods utilize a remote plasma process including chlorine containing etchants to selective etch the silicon material without attacking other portions of the substrate so as to promote etching selectivity. As such, a device structure with desired silicon material profile as well as a good pertaining of other materials/structures remained on the substrate is then obtained.

While the foregoing is directed to embodiments of the present invention, other and further embodiments of the invention may be devised without departing from the basic scope thereof, and the scope thereof is determined by the claims that follow.

What is claimed is:

1. A method for etching features in a silicon material, the method comprising:
   supplying an etching gas mixture including a chlorine containing gas to a silicon material disposed on a substrate in a processing chamber; and
   applying a remote plasma power to generate a remote plasma source from the etching gas mixture to etch the silicon material disposed on the substrate;
   forming features with high aspect ratio greater than 10:1 in the silicon material.

2. The method of claim 1, further comprising:
   forming the features in the silicon material by selectively etching the silicon material disposed on the substrate without etching a dielectric material present in the substrate.

3. The method of claim 2, wherein the silicon material is an undoped polysilicon layer or a doped polysilicon layer.

4. The method of claim 1, wherein the gas mixture comprises $Cl_2$ gas, $H_2$ gas and Ar gas.

5. A method for forming features in a silicon material, comprising:
   selectively etching a silicon material disposed on a substrate by using a remote plasma source containing chlorine etchants without fluorine etchants; and
   forming features with high aspect ratio greater than 10:1 in the silicon material.

* * * * *